(12) United States Patent
Oran

(10) Patent No.: US 7,187,256 B2
(45) Date of Patent: Mar. 6, 2007

(54) RF PACKAGE

(75) Inventor: Ekrem Oran, Nashua, NH (US)

(73) Assignee: Hittite Microwave Corporation, Chelmsford, MA (US)

( * ) Notice: Subject to any disclaimer, the term of this patent is extended or adjusted under 35 U.S.C. 154(b) by 59 days.

(21) Appl. No.: 10/782,179

(22) Filed: Feb. 19, 2004

(65) Prior Publication Data

US 2005/0184825 A1 Aug. 25, 2005

(51) Int. Cl.
*H01P 5/02* (2006.01)

(52) U.S. Cl. .................... 333/247; 333/33; 333/246; 333/238

(58) Field of Classification Search ................ 333/246, 333/247, 33, 238, 260
See application file for complete search history.

(56) References Cited

U.S. PATENT DOCUMENTS

| | | | | | |
|---|---|---|---|---|---|
| 5,014,115 | A | * | 5/1991 | Moser | 257/659 |
| 5,023,624 | A | * | 6/1991 | Heckaman et al. | 343/860 |
| 5,057,805 | A | * | 10/1991 | Kadowaki | 333/247 |
| 5,162,822 | A | * | 11/1992 | Wakamori | 333/193 |
| 5,270,673 | A | * | 12/1993 | Fries et al. | 333/246 |
| 5,294,897 | A | * | 3/1994 | Notani et al. | 333/33 |
| 5,307,237 | A | * | 4/1994 | Walz | 361/718 |
| 5,389,904 | A | * | 2/1995 | Tao et al. | 333/246 |
| 5,406,125 | A | * | 4/1995 | Johnson et al. | 257/774 |
| 5,477,137 | A | * | 12/1995 | Staudinger et al. | 324/158.1 |
| 5,528,074 | A | * | 6/1996 | Goto et al. | 257/664 |
| 5,583,468 | A | * | 12/1996 | Kielmeyer et al. | 333/33 |
| 5,602,421 | A | * | 2/1997 | Li | 257/728 |
| 5,917,388 | A | * | 6/1999 | Tronche et al. | 333/246 |
| 5,982,250 | A | * | 11/1999 | Hung et al. | 333/26 |
| 6,201,454 | B1 | * | 3/2001 | Kinayman et al. | 333/33 |
| 6,294,966 | B1 | | 9/2001 | Huang et al. | |
| 6,426,686 | B1 | * | 7/2002 | Douriet et al. | 333/247 |
| 6,538,336 | B1 | * | 3/2003 | Secker et al. | 257/786 |
| 6,646,521 | B1 | * | 11/2003 | Huang | 333/33 |
| 6,759,742 | B2 | * | 7/2004 | Budka | 257/728 |
| 6,873,230 | B2 | * | 3/2005 | Shirasaki | 333/246 |

* cited by examiner

*Primary Examiner*—Robert Pascal
*Assistant Examiner*—Kimberly E. Glenn
(74) *Attorney, Agent, or Firm*—Iandiorio & Teska

(57) ABSTRACT

A novel package includes a substrate including an upper surface ground plane connected to a lower surface ground plane by vias through the substrate, a die located on the upper ground plane and including a die pad, a transmission path including, on the upper surface of the substrate, a bonding pad connected to a first transmission line itself connected to a transition pad, and on the lower surface of the substrate, a second transmission line connected to the transition pad by a via through the substrate. A wire bond extends from the bonding pad to the die pad. A portion of the upper surface ground plane and the lower surface ground plane are connected by vias defining opposing walls on either side of the transmission path for signal isolation. A low pass filter for compensating wire bond inductance includes: a first capacitance formed between the bonding pad and at least the lower surface ground plane, the wire bond inductance, and a second capacitance formed between the die pad and at least the upper surface ground plane.

21 Claims, 11 Drawing Sheets

RF PACKAGE

FIELD OF THE INVENTION

This invention relates to a package useful in connection with monolithic microwave integrated circuits and exhibiting improved signal isolation and lower parasitic inductance.

BACKGROUND OF THE INVENTION

Integrated circuit dies such as a Monolithic Microwave Integrated Circuits (MMICs) are typically assembled into a package itself mounted on a printed circuit board (PCB) using, for example, surface mount technology.

The die is electrically connected to the package using one or more wire bonds which interconnect a die pad on the die to a bonding pad on the package which is part of a transmission path.

The wire bonds, however, have significant parasitic inductance which adversely affects the performance of the die especially at higher millimeter wave frequencies on the order of 20 GHz or more.

Thus, those skilled in the art have previously attempted to reduce the effect of the parasitic inductance of the wire bonds.

U.S. Pat. No. 6,294,966, incorporated herein by this reference, summarizes the techniques used to date and concludes that most known techniques are less than satisfactory. The '966 patent, in turn, proposes forming a capacitor very near the bonding pad of the package to form a resonant circuit with the wire bond. The resulting structure, however, results in limited impedance matching capability and, when tested, resulted in high radiation levels, poor isolation, and signal cross coupling.

SUMMARY OF THE INVENTION

It is therefore an object of this invention to provide an improved package design.

It is a further object of this invention to provide such a package design which enables enhanced impedance matching capability.

It is a further object of this invention to provide such a package which does not result in significant radiation.

It is a further object of this invention to provide such an improved package which results in good signal isolation.

It is a further object of this invention to provide such a package design which reduces signal cross coupling.

It is a further object of this invention to provide such a package which minimizes return loss.

It is a further object of this invention to provide such a package which can be tailored to accommodate different die lengths.

It is a further object of this invention to provide such a package design which provides better RF grounding.

It is a further object of this invention to provide such a package design with improved heat transfer characteristics.

It is a further object of this invention to provide such a package design which provides better physical adhesion of the package to the printed circuit board.

This invention results from the realization that an improved package design includes a uniquely designed low pass filter for increasing wire bond inductance with signal isolation effected by the combination of an upper surface ground plane and a lower surface ground plane defining opposing walls on either side of the transmission signal path.

It is a further object of this invention to provide such a package which is testable with standard automated millimeter-wave probe stations.

An exemplary package in accordance with this invention features a substrate including an upper surface ground plane connected to a lower surface ground plane by vias through the substrate. A die is located on the upper ground plane and includes a die pad. A transmission path includes, on the upper surface of the substrate, a bonding pad connected to a first transmission line itself connected to a transition pad and, on the lower surface of the substrate, a second transmission line connected to the transition pad by a via through the substrate. A wire bond extends from the bonding pad to the die pad. A portion of the upper surface ground plane and the lower surface ground plane are connected by vias defining opposing walls on either side of the transmission path for signal isolation. A low pass filter for compensating wire bond inductance includes: a first capacitance formed between the bonding pad and at least the lower surface ground plane, the wire bond inductance, and a second capacitance formed between the die pad and at least the upper surface ground plane.

One package in accordance with the subject invention features a die located on a ground structure, a transmission path including a bonding pad isolated from the ground structure, a die pad on the die, a wire bond extending between the die pad and the bonding pad, and a low pass filter for compensating wire bond inductance. The filter includes: a first capacitance formed between the bonding pad and the ground structure, the wire bond inductance, and a second capacitance formed between the die pad and the ground structure wherein, for a given frequency requirement and return loss, the first and second capacitances are tailored to reduce the wire bond inductance.

Typically, the ground structure includes an upper ground plane connected to a lower ground plane, the die is placed on the upper ground plane, and the bonding pad is co-planar with the upper ground plane. Preferably, the lower ground plane includes a portion under the bonding pad and the ground structure defines opposing walls on either side of the transmission path.

Typically, there is a substrate between the upper ground plane and the lower ground plane and vias through the substrate interconnecting the upper and lower ground planes. In the preferred embodiment, the bonding pad is connected to a first transmission line which is connected to a transition pad co-planar with the upper ground plane and the transition pad is connected to a second transmission line co-planar with the lower ground plane.

One package in accordance with this invention features a die located on a ground structure, a transmission path including a bonding pad isolated from the ground structure, a die pad on the die, and a wire bond extending between the die pad and the bonding pad. The ground structure includes opposing members on either side of the transmission path for signal isolation.

An interconnect device for use between a bonding pad on a first plane and a die pad on a second plane in accordance with this invention features at least one wire extending from the bonding pad to the die pad; the bonding pad connected to a transmission line co-planar therewith; and the transmission line connected to a transition pad co-planar therewith.

In one embodiment, the upper surface ground plane surrounds the bonding pad, the first transmission line, and the transition pad. It is preferred that the lower surface ground plane and the second transmission line terminate proximate an edge of the substrate to facilitate probing.

One embodiment of a package in accordance with this invention includes substrate including an upper surface ground plane electrically connected to a lower surface ground plane typically by vias through the substrate. A die is located on the upper ground plane and includes a die pad. A transmission path includes on the upper surface of the substrate, a bonding pad connected to a first transmission line itself connected to a transition pad and on the lower surface of the substrate, a second transmission line connected to the transition pad typically by a via through the substrate, and a wire bond extending from the bonding pad to the die pad. A portion of the upper surface ground plane and the lower surface ground plane are typically connected by vias defining opposing structure on either side of the transmission path for signal isolation.

Preferably, the upper surface ground plane surrounds the bonding pad, the first transmission line, and the transition pad and the lower surface ground plane and the second transmission line terminate proximate an edge of the substrate to facilitate probing.

One package comprises a substrate including an upper surface ground plane connected to a lower surface ground plane typically by vias through the substrate. A transmission path includes, on the upper surface of the substrate, a bonding pad electrically connected to a first transmission line and, on the lower surface of the substrate, a second transmission line electrically connected to the first transmission line typically by a via through the substrate. A portion of the upper surface ground plane and the lower surface ground plane are typically connected by vias and define opposing walls on either side of the transmission path for signal isolation. Preferably, the upper surface ground plane surrounds the bonding pad and the first transmission line.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
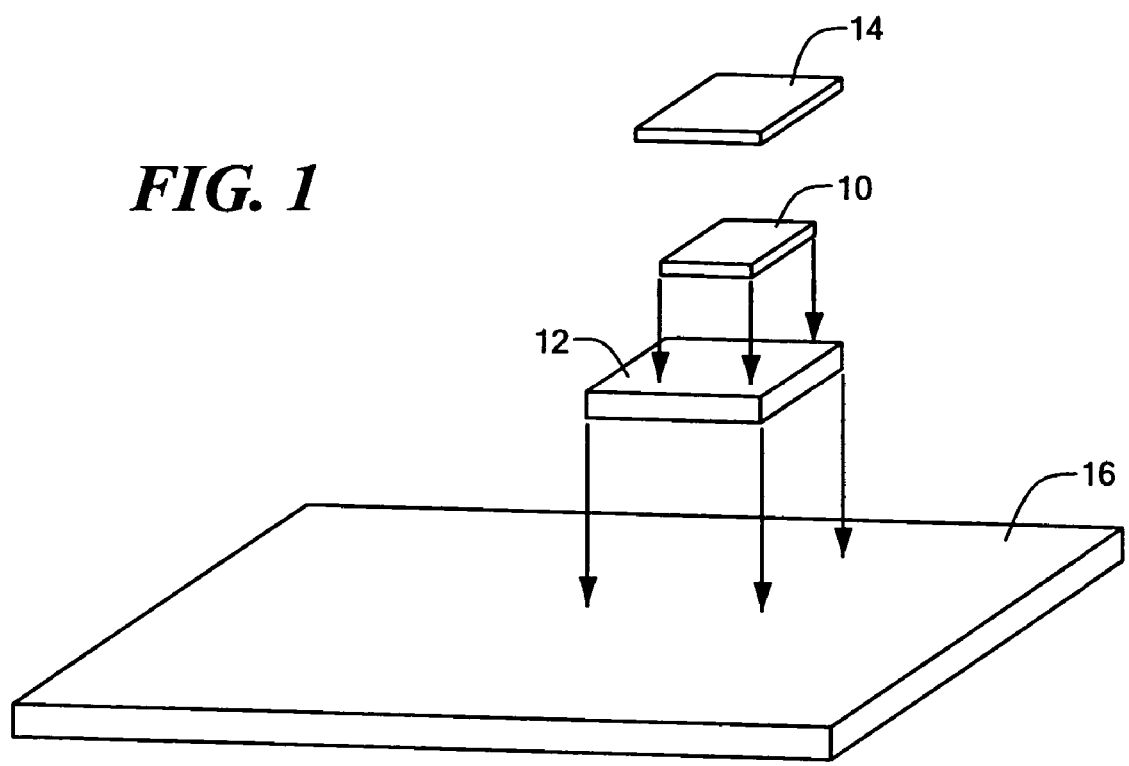
FIG. 1 is a schematic exploded view of a typical die housed in a package mounted to a printed circuit board.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

As disclosed in the background section above, an integrated circuit die such as a Monolithic Microwave Integrated Circuit (MMIC) 10, FIG. 1 is typically assembled into a package 12 including cover 14. The package is mounted on printed circuit board 16 using, for example, surface mount technology.

Figure 2:
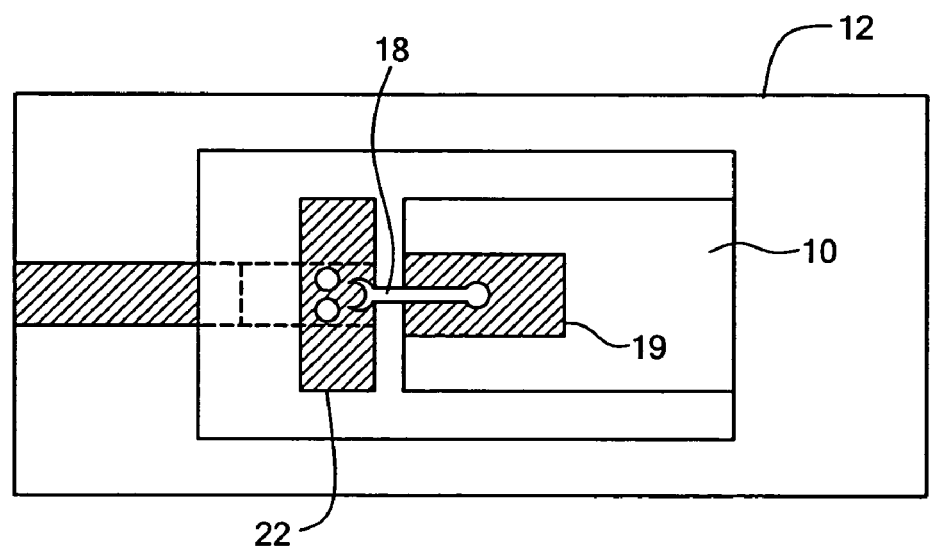
FIG. 2 is a plan view of a prior art package in accordance with U.S. Pat. No. 6,294,966.

In the prior art, die 10, FIG. 2 is connected to package 12 using one or more wire bonds 18 which interconnect die port 19 of die 10 to bonding pad 22 on package 12 which is part of the transmission path. To reduce the effect of the parasitic inductance of wire bond 18, U.S. Pat. No. 6,294,966 proposes forming a capacitor very near bonding pad 22 to form a resonant circuit with the wire bond. The resulting structure, however, results in limited impedance matching capability and, when tested, resulted in high radiation levels, poor isolation, and cross coupling. A series inductance with capacitance to ground on only a single side as shown in FIG. 2 can be a low pass filter structure in a manner of speaking but with very limited impedance matching capability.

Figure 3:
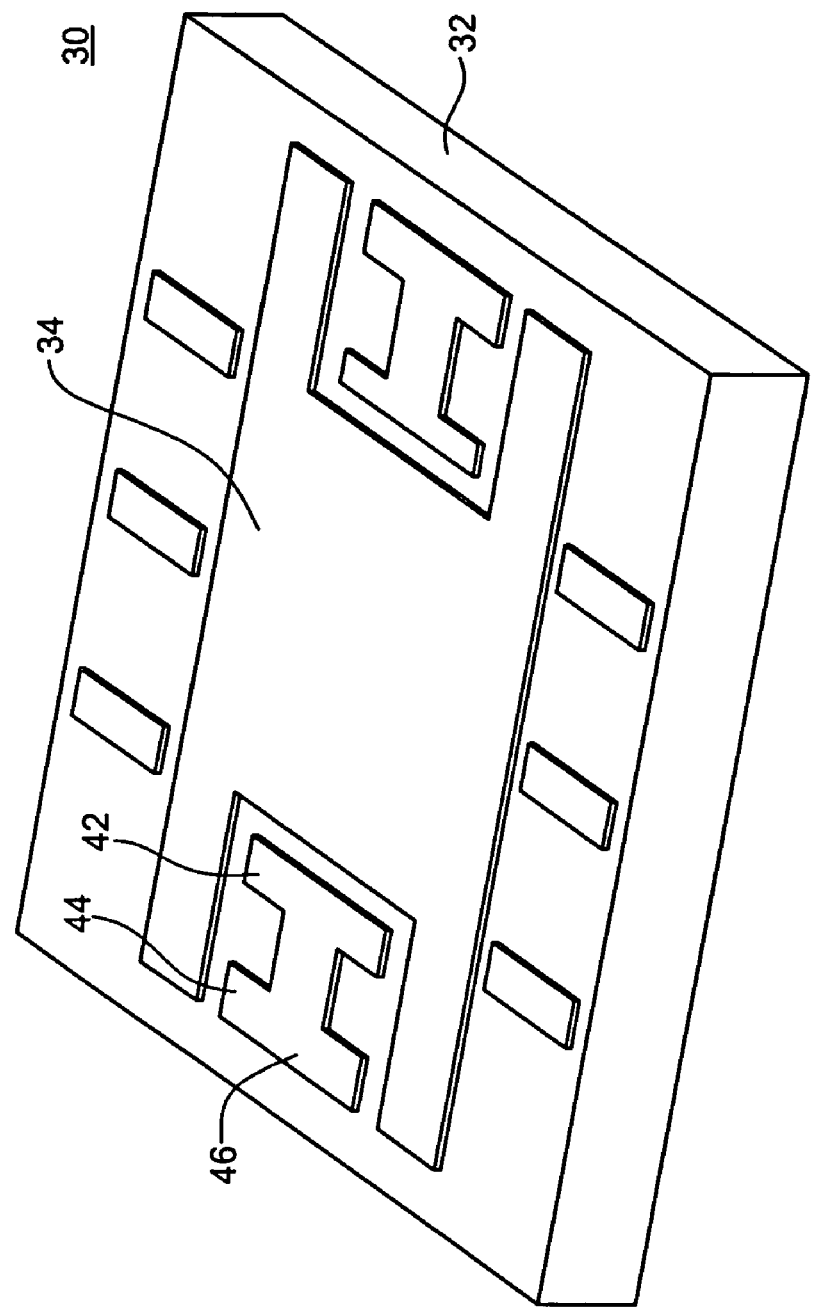
FIG. 3 is a schematic three-dimensional view showing the top of one package in accordance with the subject invention.
Figure 4:
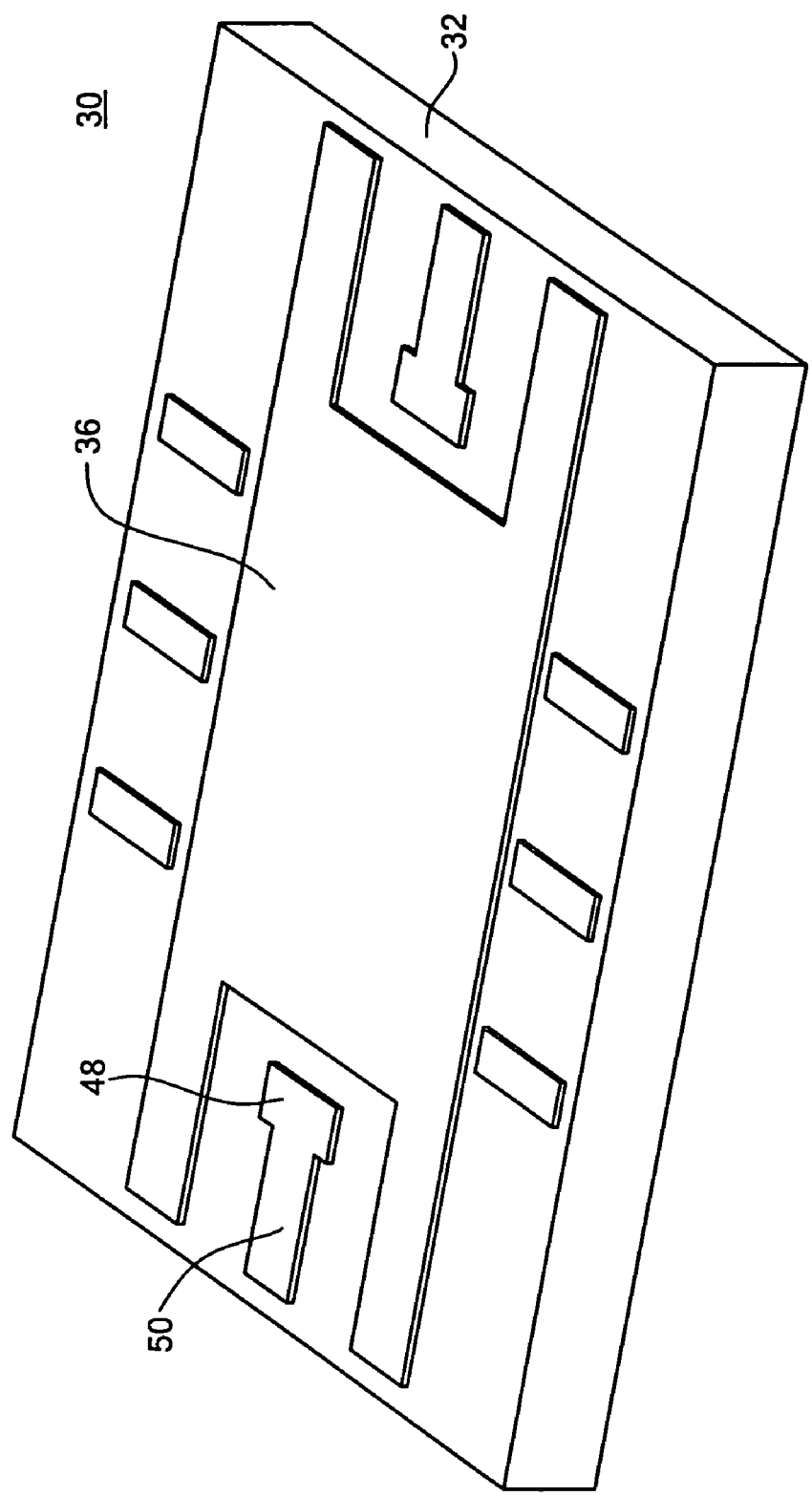
FIG. 4 is a schematic three-dimensional view showing the bottom of the package of FIG. 3.

In accordance with the subject invention, package 30, FIGS. 3 and 4 includes substrate 32 with upper surface ground plane 34, FIG. 3 and lower surface ground plane 36, FIG. 4. Upper surface ground plane 34 is connected to lower surface ground plane 36 by vias 38, FIG. 5 through the substrate (not shown in FIG. 5 for clarity). This ground structure is ultimately connected to ground via the printed circuit board to which package 30 is mounted using surface mount technology. Typically, vias 38 are copper filled vias.

Figure 5:
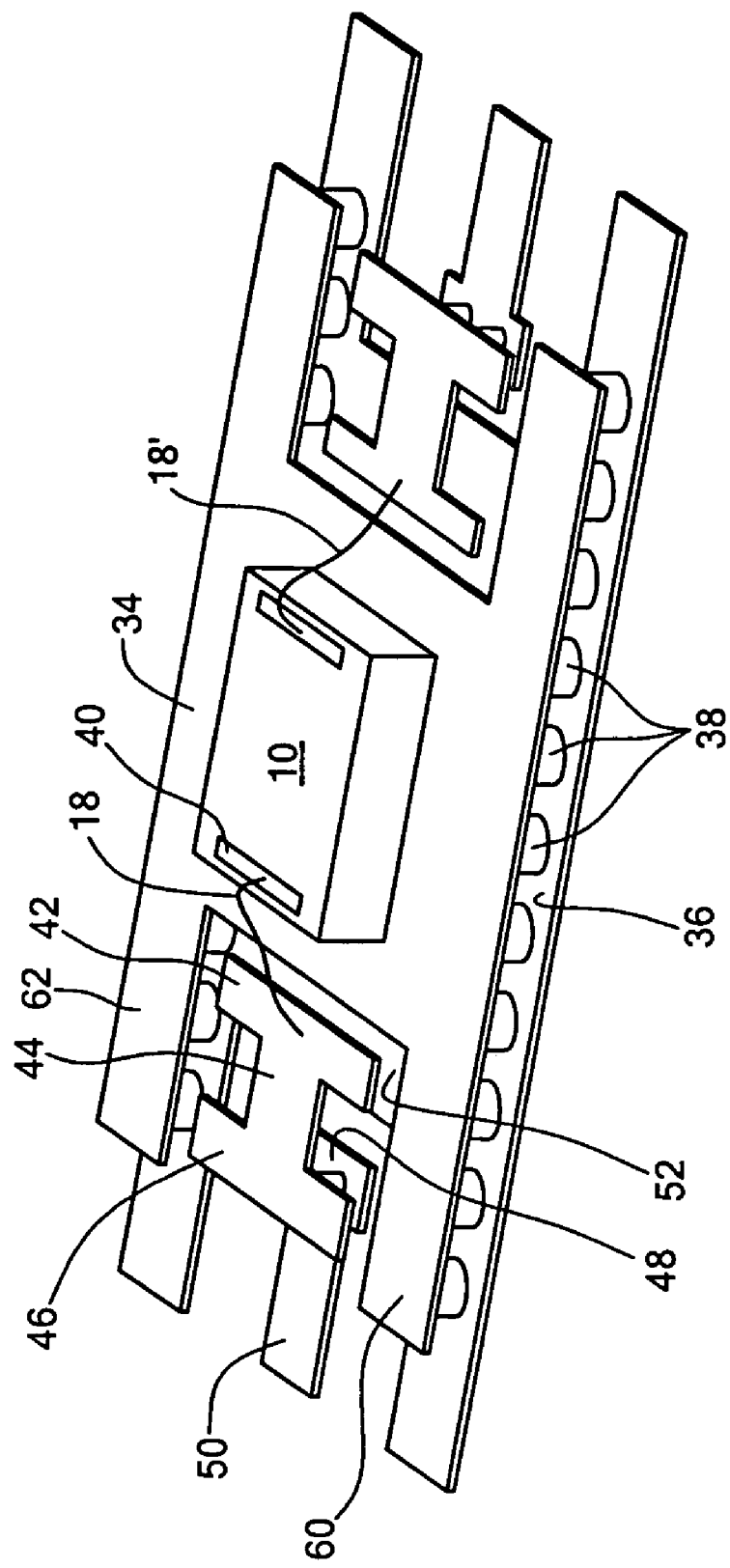
FIG. 5 is a schematic three-dimensional view showing a die mounted on the package of FIGS. 3–4 with the substrate between the upper and lower ground planes removed for clarity.
Figure 6:
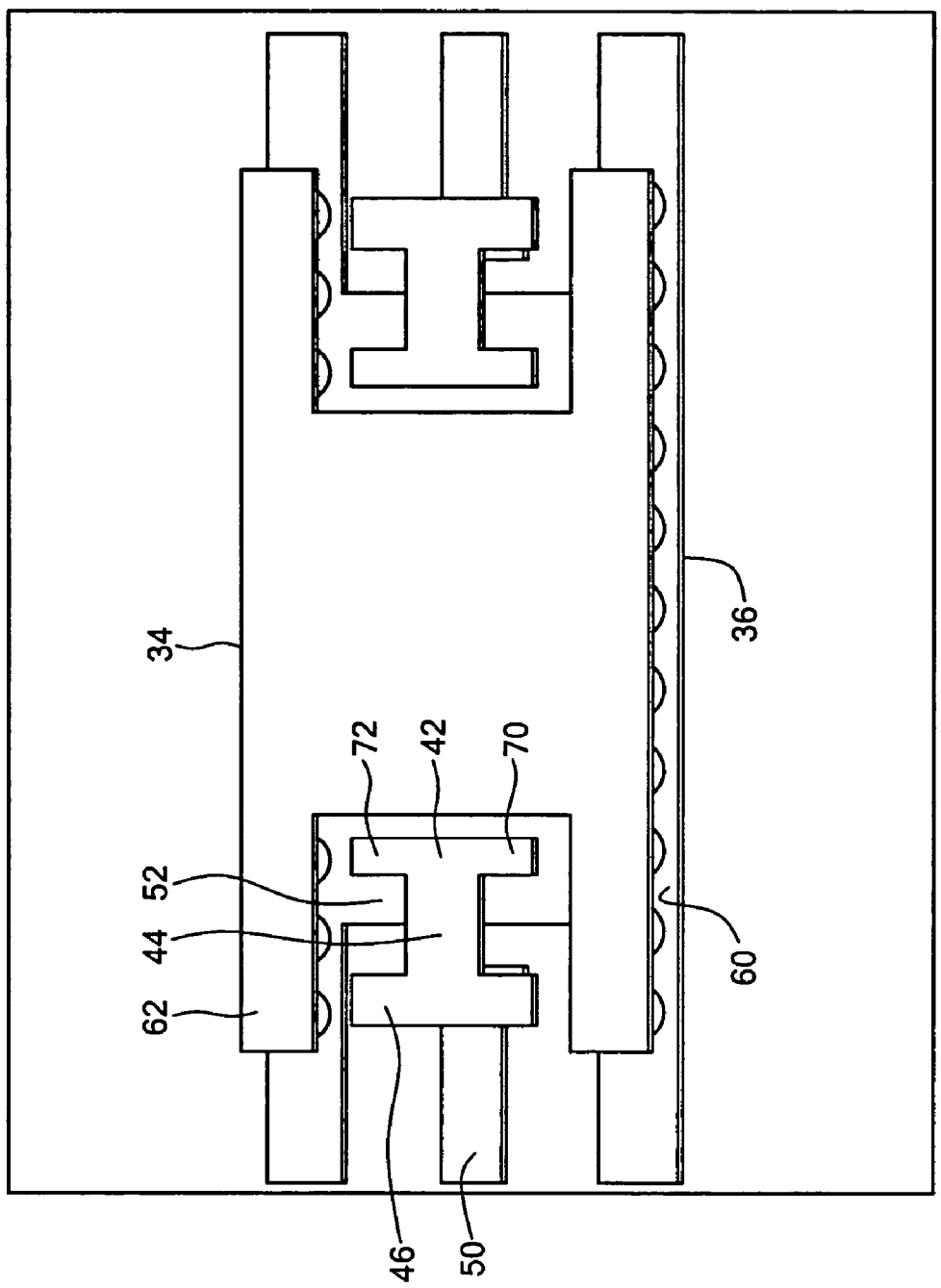
FIG. 6 is a three-dimensional schematic top view of the package of FIG. 5 again with the substrate removed for clarity.

Die 10, FIGS. 5-6 is located on upper surface ground plane 34 and includes die pad 40. Wire bond 18 and/or wire bond 18' extends from die pad 40 to bonding pad 42 isolated from the ground structure defined by upper ground plane 34 and lower ground plane 36. There may be more than one wire bond from the die to each bonding pad shown in FIGS. 5 and 6. In FIG. 5, by way of example, wire bond 18 may be considered the input to die 10 and wire bond 18' considered the output. Thus, in this particular embodiment, the package is symmetrical in structure.

Bonding pad 42 is itself a part of a transmission path defined by: transmission line 44 and transition pad 46 co-planar with the upper ground plane 34; transition pad 48 and transmission line 50 co-planar with the lower ground plane 36; and vias 38 through the substrate connecting transition pad 46 with transition pad 48. The same structure exists for the output side of die 10 and wire bond 18' as shown in FIGS. 3–6. Thus, wire 18 extends from bonding pad 42 to die pad 40, bonding pad 42 is connected to transmission line 44 co-planar with bonding pad 42, and transmission line 44 is connected to transition pad 46 co-planar therewith.

To compensate for the inductance of wire bond 18 (and 18'), a pi type low pass filter includes a first capacitance formed between bonding pad 42 and the ground structure of upper ground plane 34 and lower ground plane 36, primarily portion 52 of lower ground plane 36 under bonding pad 42. The low pass filter also includes the wire bond 18 inductance and a second capacitance formed between die pad 40, FIG. 5 and the ground structure of upper ground plane 34 and lower ground plane 36. Typically, the bottom of die 10 includes metallization which itself forms a part of a ground structure.

In this way, for a given frequency requirement and a desired return loss, the first and second capacitances are chosen, typically to be equal or approximately equal, and tailored to reduce the impedance of wire bond 18 by determining the appropriate area and thickness of die bond pad 40, bond pad 42, and the like. The remainder of the transmission path is also tailored to effect proper signal isolation and to reduce parasitic impact. The Bode-Fano criteria is a theoretical limit on the minimum return loss that can be obtained over a given bandwidth using an arbitrary matching network. The pi low pass filter structure of the subject invention used to absorb the bond wire inductance from the die to the package transition is a close to optimum approximation of the Bode-Fano criteria.

By separating the die to package transition (bond pad 42, wire bond 18, and die bond pad 40) from the Z-plane transition (transition pad 46, transition pad 48, and the via or vias between them), top ground plane 34 can be varied to fit different die lengths but bottom ground plane 36 can be standardized. Thus, board designers can readily switch between different dies and yet keep the same board footprint.

Also, since bottom ground plane 36 is larger than die 10, the result is better RF grounding, improved heat transfer, increased signal isolation, and better physical adhesion of the package to the board.

Also, the package insert of FIG. 2 cannot be tested using a high frequency mmW probe. In contrast, the package of FIGS. 3–6 has a CPWG transmission line on the bottom at the extremities of the package. These CPWG lines will enable the use of Ground-Signal-Ground high frequency mmW probes in order to test MMIC dies once inside the package. This capability will speed up testing times, perhaps even by a factor greater than 4:1.

In the preferred embodiment, the ground structure defined by bottom ground plane 36, top ground plane 34, and the vias 38 between them define opposing walls or members 60 and 62 on either side of the transmission path for increased signal isolation. In the areas of walls 60 and 62, it is preferred that the vias between top ground plane 34 and bottom ground plane 36 be fairly dense or at least the density of the vias increased.

The result is an improved RF package design with enhanced impedance matching capabilities. Radiation leakage is minimized, signal isolation is good, and there is little signal cross coupling. The return loss is minimized and at the same time the subject design facilitates tailoring to accommodate different die lengths. RF grounding is improved as is heat transfer.

In some embodiments, however, the stubs 70 and 72, FIG. 6 of bonding pad 42 may be removed and still good results were obtained during evaluation.

Figure 7:
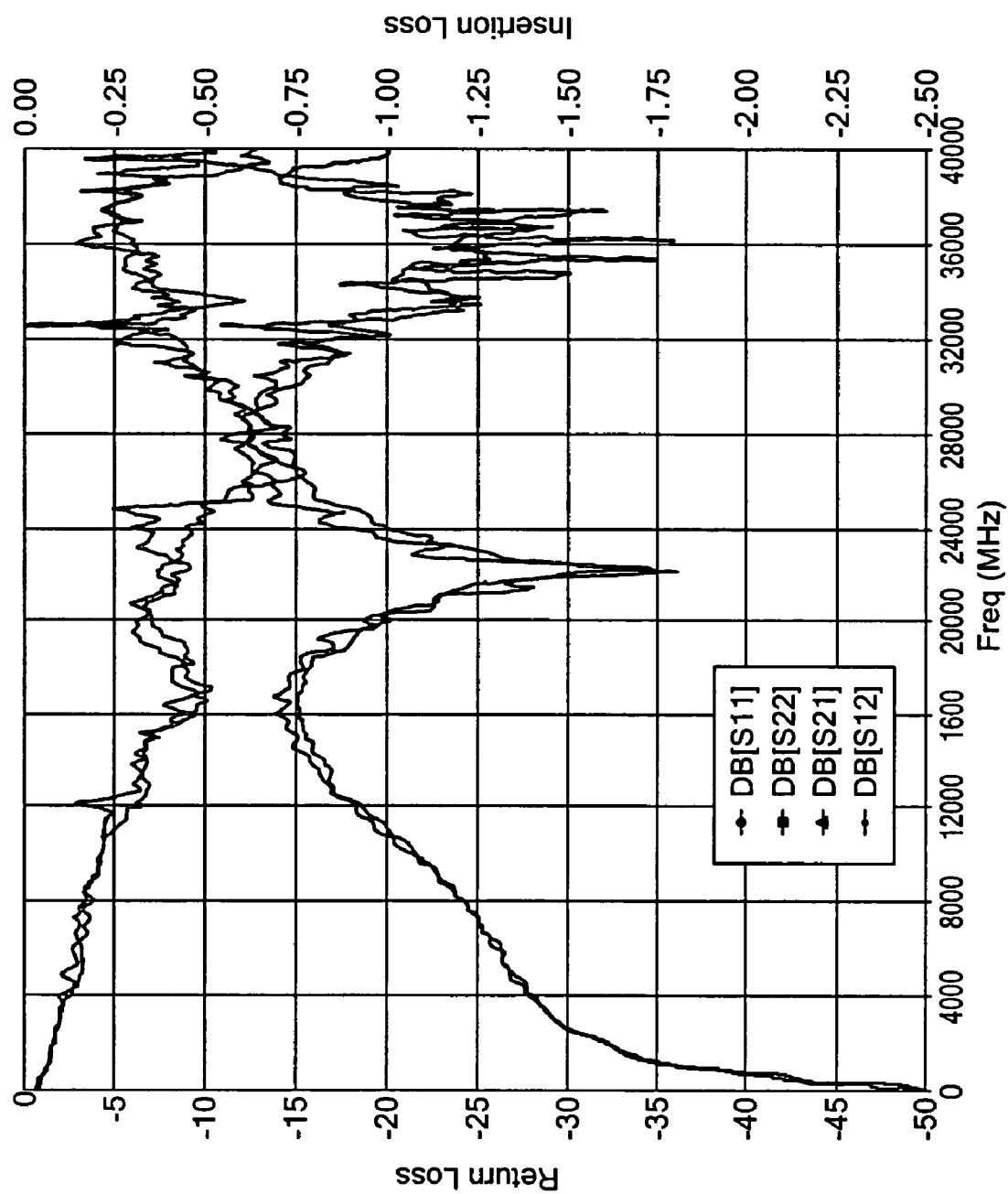
FIG. 7 is a graph showing the insertion loss and return loss as a function of frequency for the package of FIGS. 3–6.
Figure 8:
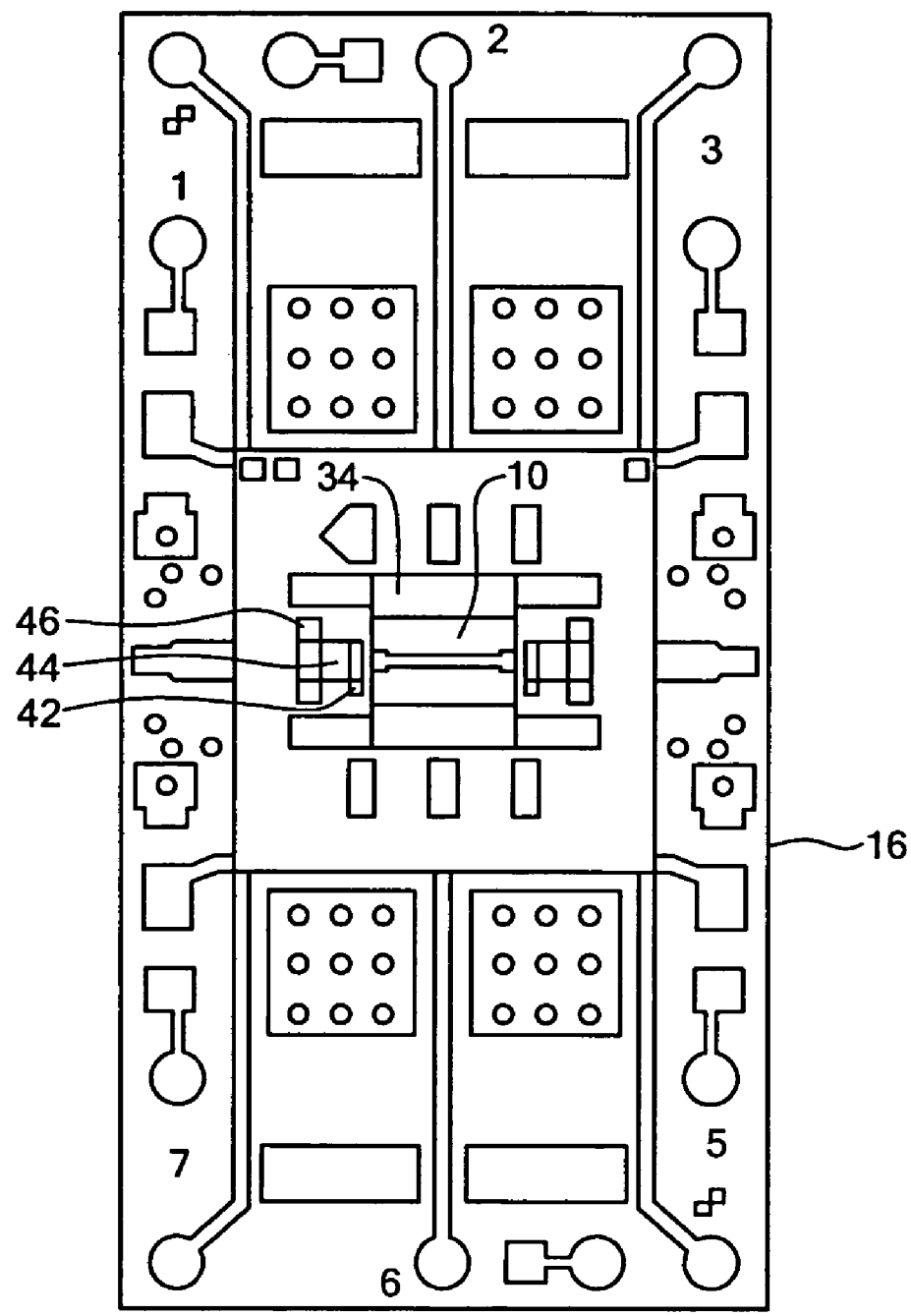
FIG. 8 is a plan view of a package in accordance with the subject invention mounted on a printed circuit board.

FIG. 7 shows that for the design of FIGS. 3–6, when implemented on printed circuit board 16, FIG. 8, the return loss was below 15 dB and the insertion loss was approximately zero.

The low pass filter matching structure of the subject invention effectively absorbs wire bond inductance up to 40 GHz. In the subject invention, bond pad parasitic capacitance is removed from the die design problem and incorporated into the transition from the MMIC to the package. High volume wire bond attachment techniques can be incorporated instead of low volume ribbon bond attachments. The 50 Ohm co-planar wave guide with a ground plane 34, FIG. 5 on the top layer is led the edge of the package where the transition in the Z-plane is performed to reach the bottom of the package through transition pads 46 and 48. Using this concept, the MMIC die to package transition is separated from the transition in the Z-plane. This approach provides the benefit of a standard bottom footprint while the top layer 34 can be tailored to fit different MMIC die lengths. Board designers using MMICs packaged in this fashion can readily switch between different MMICs and keep the same board foot print. Also, the bottom ground area is larger than the MMIC die itself there by providing better RF grounding, improved heat transfer, increased signal isolation, and better physical adhesion of the package to the board.

Figure 9:
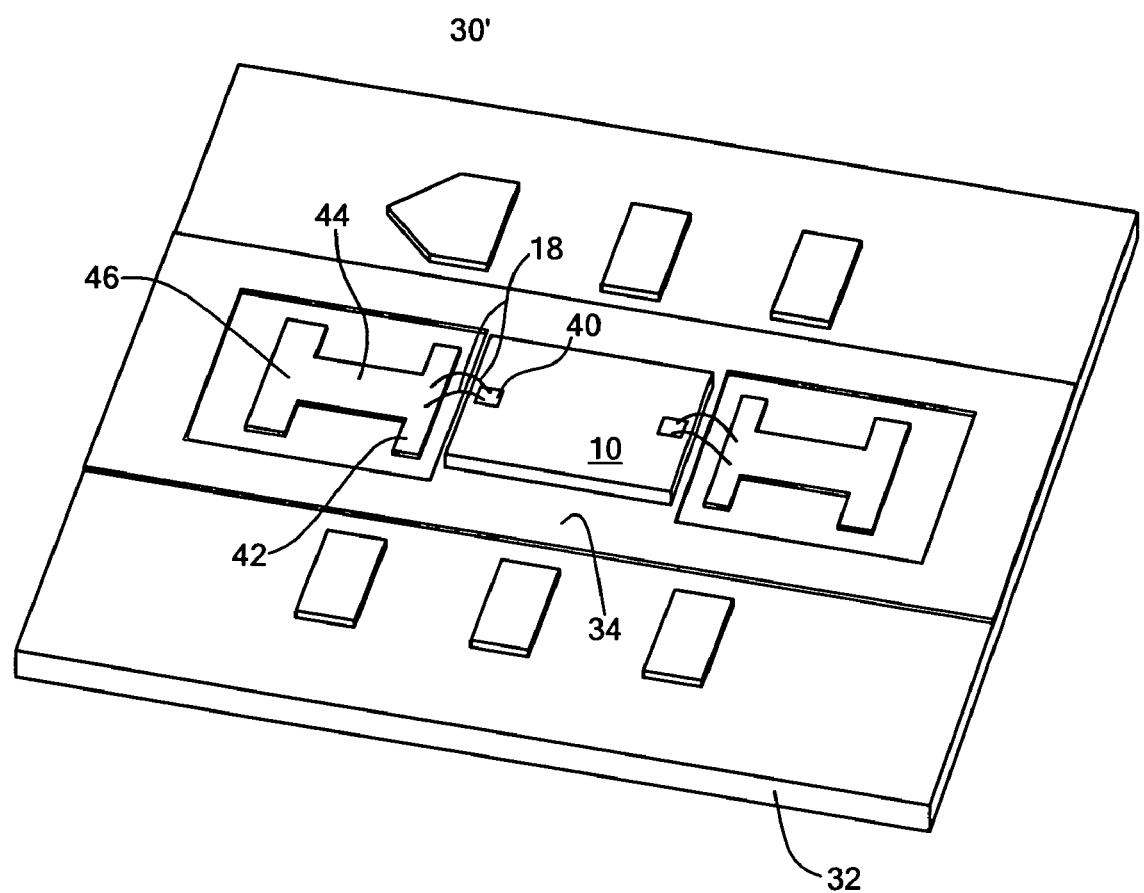
FIG. 9 is a schematic three-dimensional top view of another embodiment of a package in accordance with the subject invention.
Figure 10:
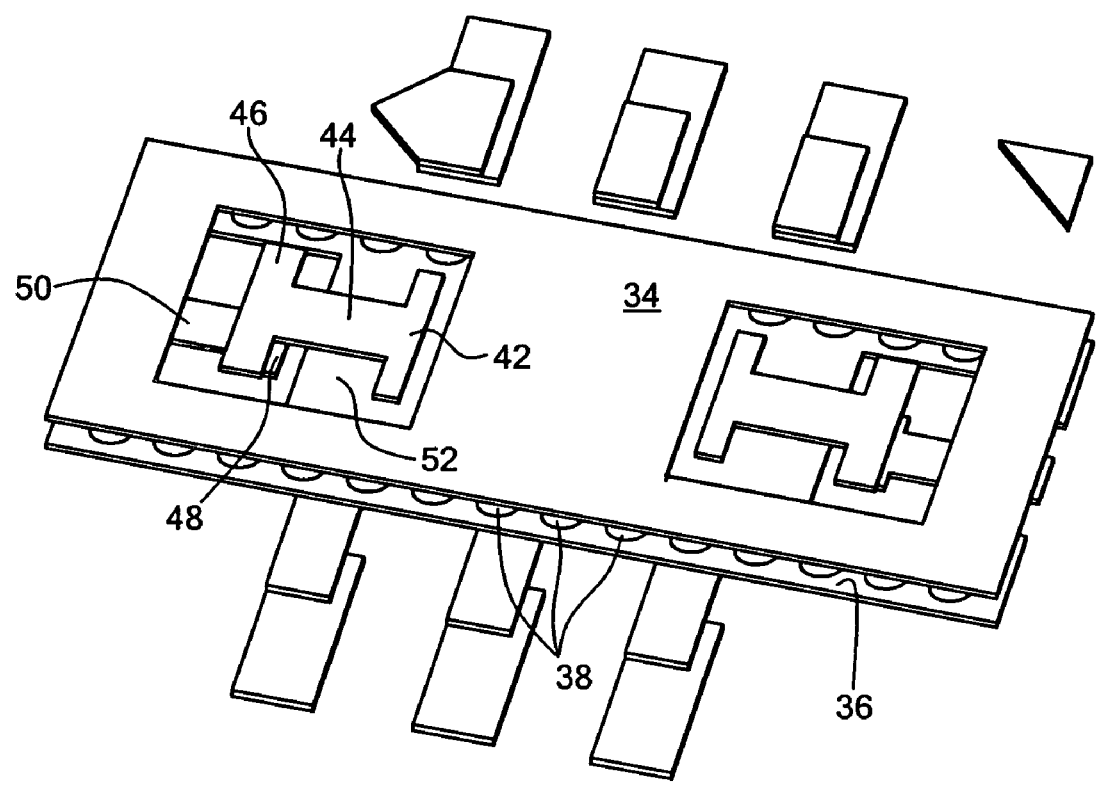
FIG. 10 is a schematic three-dimensional top view showing of package of FIG. 9 with the substrate removed for clarity.
Figure 11:
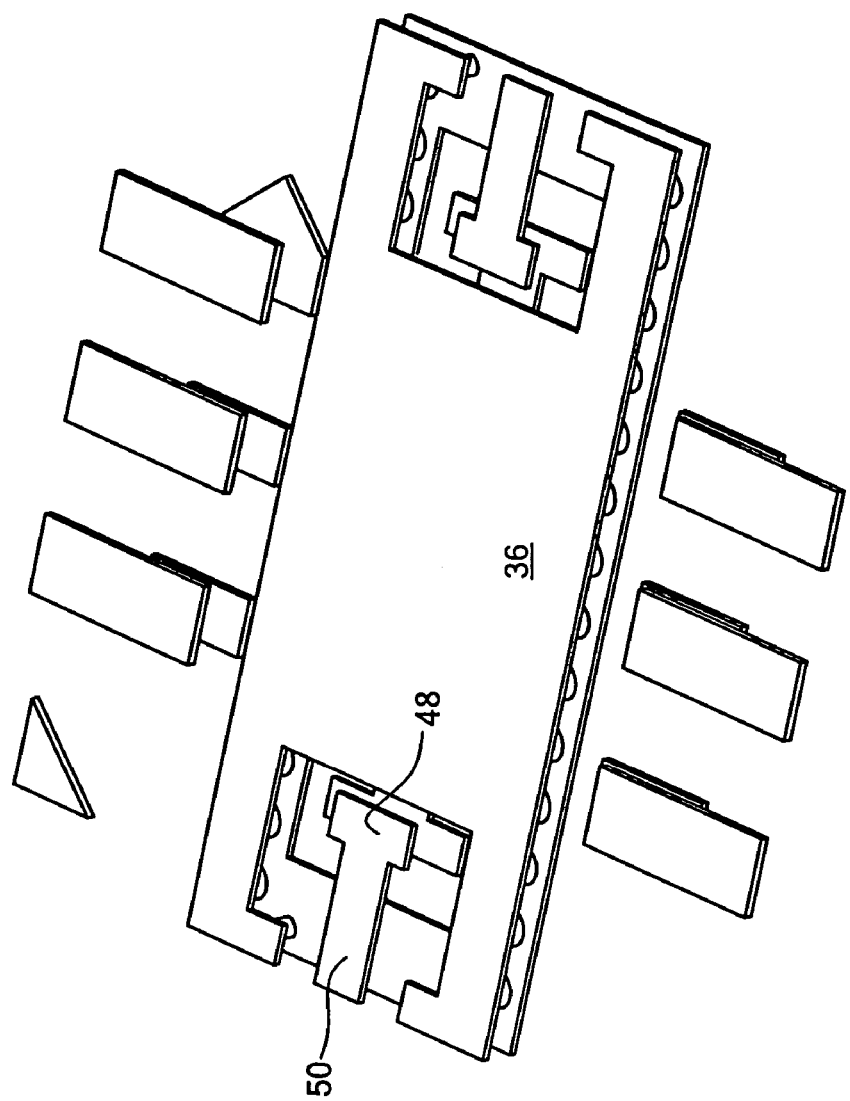
FIG. 11 is a schematic three-dimensional bottom view of the package of FIGS. 9 and 10 again with the substrate removed for clarity.

In accordance with the embodiment of FIGS. 9–12 of the subject invention, package 30 includes substrate 32 with upper surface ground plane 34, FIG. 9 and lower surface ground plane 36, FIG. 10. Upper surface ground plane 34 is connected to lower surface ground plane 36 by vias 38, FIG. 10 through the substrate which is not shown in FIGS. 10–12 for clarity.

Die 10, FIG. 9 is located on upper surface ground plane 34 and includes die pad 40. Wire bonds 18 extend from die pad 40 to bonding pad 42 isolated from the ground structure defined by upper ground plane 34 and lower ground plane 36.

Figure 12:
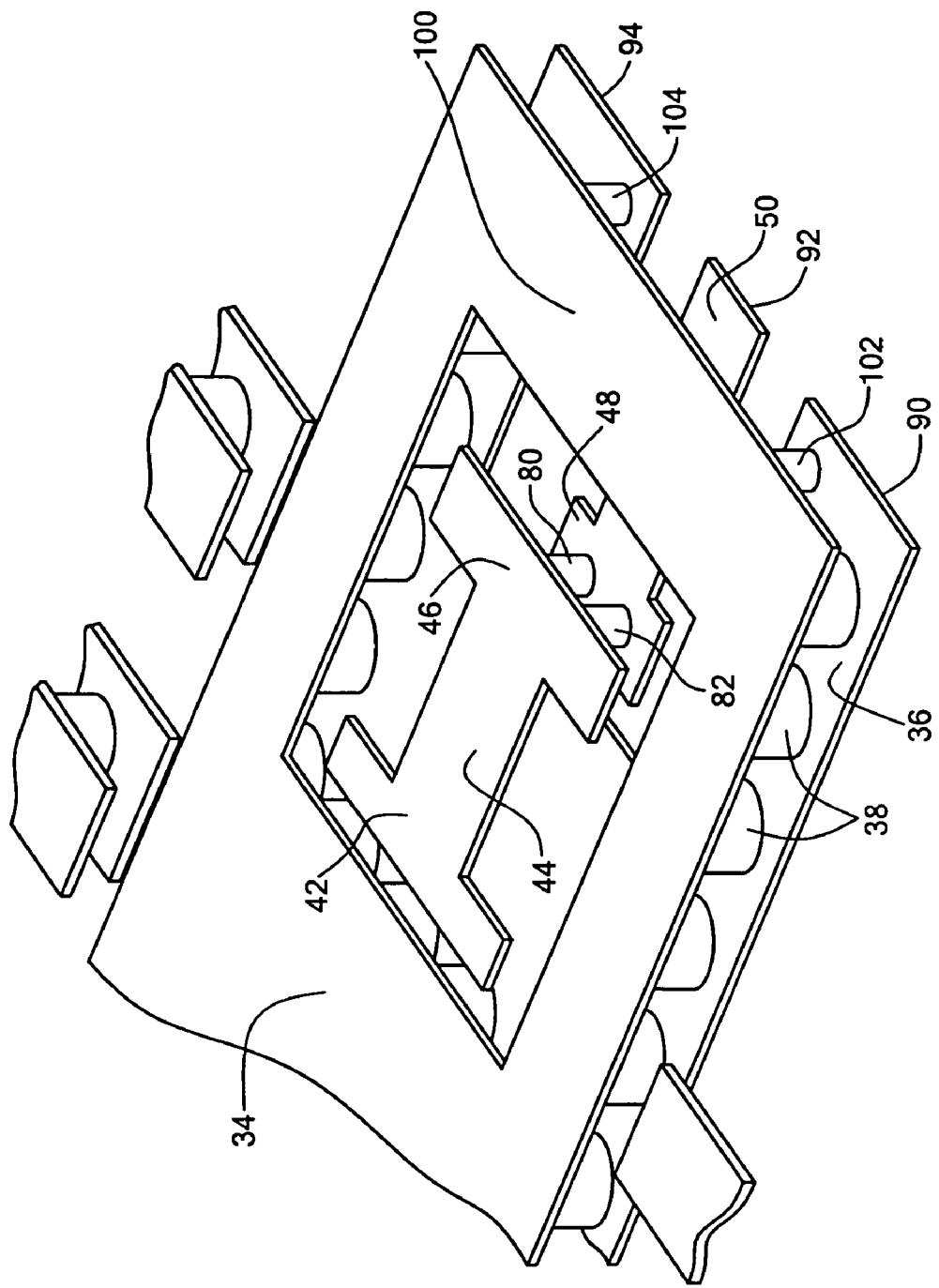
FIG. 12 is a schematic three-dimensional top view of a portion of the package of FIGS. 9–11 also with the substrate removed for clarity.

Bonding pad 42, FIG. 12 is itself a part of a transmission path defined by transmission line 44 and transition pad 46 both co-planar with the upper ground plane 34; transition pad 48 and transmission line 50 both co-planar with lower ground plane 36; and vias 80 and 82 through the substrate connecting transition pad 46 with transition pad 48.

The package of FIGS. 9–12 has a CPWG transmission line on the bottom at the extremities of the package which enable the use of Ground-Signal-Ground high frequency mmW probes placed at locations 90, 92, and 94, FIG. 12 in order to test MMIC dies once inside the package. This capability speeds up testing times since smaller high pitch frequency millimeter wave RF probes can be used.

The ground structure defined by bottom ground plane 36, top ground plane 34, and the vias 38 between them define opposing walls on either side of the transmission path for increased signal isolation. In this embodiment, ground strip 100 results in upper surface ground plane 34 fully surrounding bonding pad 42, transmission line 44, and transition pad 46. Lower surface ground plane 36 terminates proximate the edge of the substrate as shown in FIG. 12 as does transmission line 92 to facilitate probing as discussed above in an automated fashion. Ground strip 100 is connected to lower surface ground plane 36 by vias 102 and 104. In other embodiments, ground plane 34 can be enlarged in area to better effect sealing of the cover over the substrate.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, the embodiment disclosed in the subject application is not to be taken as the only possible embodiment. Other embodiments will occur to those skilled in the art and are within the following claims:

What is claimed is:

1. A package comprising:
    a substrate including an upper surface ground plane connected to a lower surface ground plane by vias through the substrate;
    a die located on the upper ground plane and including a die pad;
    a transmission path including:
        on the upper surface of the substrate, a bonding pad connected to a first transmission line itself connected to a transition pad and
        on the lower surface of the substrate, a second transmission line connected to the transition pad by a via through the substrate;
    a wire bond extending from the bonding pad to the die pad;
    a portion of the upper surface ground plane and the lower surface ground plane connected by vias defining opposing walls on either side of the transmission path for signal isolation; and
    a low pass filter for compensating wire bond inductance, the filter including:
        a first capacitance formed between the bonding pad and at least the lower surface ground plane,
        the wire bond inductance, and
        a second capacitance formed between the die pad and at least the upper surface ground plane.

2. A package comprising:
    a die located on a ground structure;
    a transmission path including a bonding pad isolated from the ground structure;
    a die pad on the die;
    a wire bond extending between the die pad and the bonding pad; and
    a low pass filter for compensating wire bond inductance, the filter including:
        a first capacitance formed between the bonding pad and the ground structure,
        the wire bond inductance, and
        a second capacitance formed between the die pad and the ground structure wherein, for a given frequency requirement and return loss, the first and second capacitances are tailored to reduce the wire bond inductance.

3. The package of claim 2 in which the ground structure includes an upper ground plane connected to a lower ground plane, the die is placed on the upper ground plane, and the bonding pad is co-planar with the upper ground plane.

4. The package of claim 3 in which the lower ground plane includes a portion under the bonding pad.

5. The package of claim 3 in which the ground structure defines opposing walls on either side of the transmission path.

6. The package of claim 3 further including a substrate between the upper ground plane and the lower ground plane.

7. The package of claim 6 further including vias through the substrate interconnecting the upper and lower ground planes.

8. The package of claim 3 in which the bonding pad is connected to a first transmission line which is connected to a transition pad co-planar with the upper ground plane and the transition pad is connected to a second transmission line co-planar with the lower ground plane.

9. A package comprising:
    a substrate including an upper surface ground plane connected to a lower surface ground plane by vias through the substrate;
    a die located on the upper ground plane and including a die pad;
    a transmission path including:
        on the upper surface of the substrate, a bonding pad connected to a first transmission line itself connected to a transition pad and,
        on the lower surface of the substrate, a second transmission line connected to the transition pad by a via through the substrate;
    a wire bond extending from the bonding pad to the die pad; and
    a portion of the upper surface ground plane and the lower surface ground plane connected by vias defining opposing walls on either side of the transmission path for signal isolation.

10. The package of claim 9 further including a low pass filter for compensating wire bond inductance, the filter including:
    a first capacitance formed between the bonding pad and at least the lower surface ground plane,
    the wire bond inductance, and
    a second capacitance formed between the die pad and at least the upper surface ground plane.

11. The package of claim 9 in which the upper surface ground plane surrounds the bonding pad, the first transmission line, and the transition pad.

12. The package of claim 9 in which the lower surface ground plane and the second transmission line terminate proximate an edge of the substrate to facilitate probing.

13. A package comprising:
    a substrate including an upper surface ground plane connected to a lower surface ground plane by vias through the substrate;
    a die located on the upper ground plane and including a die pad;
    a transmission path including:
        on the upper surface of the substrate, a bonding pad connected to a first transmission line itself connected to a transition pad and,
        on the lower surface of the substrate, a second transmission line connected to the transition pad by a via through the substrate;
    a wire bond extending from the bonding pad to the die pad;
    a portion of the upper surface ground plane and the lower surface ground plane connected by vias defining opposing walls on either side of the transmission path for signal isolation;
    the upper surface ground plane surrounding the bonding pad, the first transmission line, and the transition pad; and the lower surface ground plane and the second transmission line terminating proximate an edge of the substrate to facilitate probing.

14. A package comprising:
    a substrate including an upper surface ground plane electrically connected to a lower surface ground plane;
    a transmission path including:
        on the upper surface of the substrate, a bonding pad electrically connected to a first transmission line and,
        on the lower surface of the substrate, a second transmission line electrically connected to the first transmission line;

a portion of the upper surface ground plane and the lower surface ground plane defining structure on either side of the transmission path for signal isolation; and the upper surface ground plane surrounding the bonding pad and the first transmission line.

15. A package comprising:
a substrate including an upper surface ground plane electrically connected to a lower surface ground plane;
a transmission path including:
on the upper surface of the substrate, a bonding pad electrically connected to a first transmission line and,
on the lower surface of the substrate, a second transmission line electrically connected to the first transmission line;
a portion of the upper surface ground plane and the lower surface ground plane defining structure on either side of the transmission path for signal isolation, including a portion of the upper surface ground plane surrounding the bonding pad and the first transmission line; and
the lower surface ground plane and the second transmission line terminating proximate an edge of the substrate to facilitate probing.

16. A package comprising:
a substrate including an upper surface ground plane connected to a lower surface ground plane by vias through the substrate;
a die located on the upper ground plane and including a die pad;
a transmission path including:
on the upper surface of the substrate a bonding pad connected to a first transmission line itself connected to a transition pad and,
on the lower surface of the substrate a second transmission line connected to the transition pad by a via through the substrate;
a wire bond extending from the bonding pad to the die pad; and
a low pass filter for compensating wire bond inductance, the filter including:
a first capacitance formed between the bonding pad and at least the lower surface ground plane,
the wire bond inductance, and
a second capacitance formed between the die pad and at least the upper surface ground plane.

17. The package of claim 16 further including a portion of the upper surface ground plane and the lower surface ground plane connected by vias defining opposing walls on either side of the transmission path for signal isolation.

18. An interconnect device for use between a bonding pad on a first plane and a die pad on a second plane, the device comprising:
a ground plane co-planar with the first plane;
at least one wire extending from the bonding pad to the die pad;
the bonding pad co-planar with the ground plane and connected to a transmission line co-planar therewith; and
the transmission line connected to a transition pad co-planar therewith.

19. A package comprising:
a substrate including an upper surface ground plane connected to a lower surface ground plane by vias through the substrate;
a die located on the upper ground plane and including a die pad;
a transmission path including:
on the upper surface of the substrate, a bonding pad connected to a first transmission line itself connected to a transition pad and,
on the lower surface of the substrate, a second transmission line connected to the transition pad by a via through the substrate;
a wire bond extending from the bonding pad to the die pad; and
a portion of the upper surface ground plane and the lower surface ground plane connected by vias defining opposing walls on either side of the transmission path for signal isolation,
wherein the lower surface ground plane and the second transmission line terminate proximate an edge of the substrate to facilitate probing.

20. A package comprising:
a substrate including an upper surface ground plane connected to a lower surface ground plane by vias through the substrate;
a die located on the upper ground plane and including a die pad;
a transmission path including:
on the upper surface of the substrate, a bonding pad co-planar with said upper surface ground plane connected to a first transmission line itself connected to a transition pad and,
on the lower surface of the substrate, a second transmission line connected to the transition pad by a via through the substrate;
a wire bond extending from the bonding pad to the die pad; and
a portion of the upper surface ground plane and the lower surface ground plane connected by vias defining opposing walls on either side of the transmission path for signal isolation.

21. A package comprising:
a substrate including an upper surface ground plane connected to a lower surface ground plane by vias through the substrate;
a die located on the upper ground plane and including a die pad;
a transmission path including:
on the upper surface of the substrate, a bonding pad connected to a first transmission line itself connected to a transition pad, the bonding pad wider than the first transmission line, and,
on the lower surface of the substrate, a second transmission line connected to the transition pad by a via through the substrate;
a wire bond extending from the bonding pad to the die pad; and
a portion of the upper surface ground plane and the lower surface ground plane connected by vias defining opposing walls on either side of the transmission path for signal isolation.

* * * * *